(12) United States Patent
Hung et al.

(10) Patent No.: US 11,991,850 B2
(45) Date of Patent: May 21, 2024

(54) RISER CAGE FASTENERS FOR AN INFORMATION HANDLING SYSTEM

(71) Applicant: Dell Products L.P., Round Rock, TX (US)

(72) Inventors: Hsiang-Yin Hung, Taipei (TW); Kuang-Hsi Lin, Taoyuan (TW); Yi-Hsin Kuan, Taipei (TW)

(73) Assignee: Dell Products L.P., Round Rock, TX (US)

( * ) Notice: Subject to any disclaimer, the term of this patent is extended or adjusted under 35 U.S.C. 154(b) by 2 days.

(21) Appl. No.: 17/647,692

(22) Filed: Jan. 11, 2022

(65) Prior Publication Data

US 2023/0225070 A1 Jul. 13, 2023

(51) Int. Cl.
*H05K 7/14* (2006.01)
*G06F 1/18* (2006.01)

(52) U.S. Cl.
CPC ........... *H05K 7/1417* (2013.01); *G06F 1/184* (2013.01); *G06F 1/185* (2013.01); *H05K 7/1402* (2013.01); *H05K 7/1429* (2013.01); *G06F 1/186* (2013.01)

(58) Field of Classification Search
CPC ....... G06F 1/185; G06F 1/184; G11B 33/124; H05K 7/1417; H05K 7/1402; H05K 7/1424; H05K 7/1429
See application file for complete search history.

(56) References Cited

U.S. PATENT DOCUMENTS

| 5,535,100 A | * | 7/1996 | Lubahn | G06F 1/184 361/752 |
| 2021/0360812 A1 | * | 11/2021 | Chen | G06F 1/185 |
| 2022/0272859 A1 | * | 8/2022 | Zhang | H05K 1/141 |

* cited by examiner

*Primary Examiner* — James Wu
(74) *Attorney, Agent, or Firm* — Norton Rose Fulbright US LLP

(57) ABSTRACT

Securing a riser cage and/or electronic components coupled thereto within an information handling system can be accomplished using a riser cage apparatus. The riser cage may be configured to removably secure the electronic components to a surface of the information handling system using one or more fasteners configured to couple the riser cage to a surface of a chassis. The one or more fasteners may comprise a protrusion configured to engage a pin coupled to the surface. The protrusion of the one or more fasteners may be movable relative to the riser cage between a first locked position in which the pin coupled to the surface is engaged by the protrusion and a second unlocked position in which the pin coupled to the surface is not engaged by the protrusion.

13 Claims, 6 Drawing Sheets

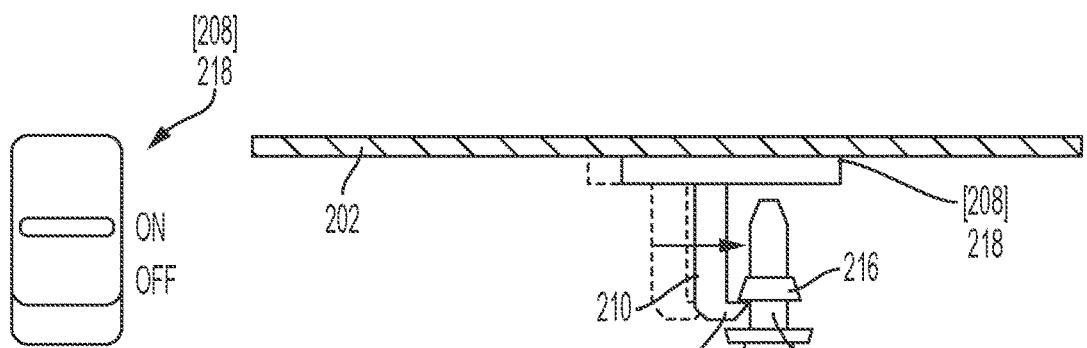
FIG. 3A
FIG. 3B
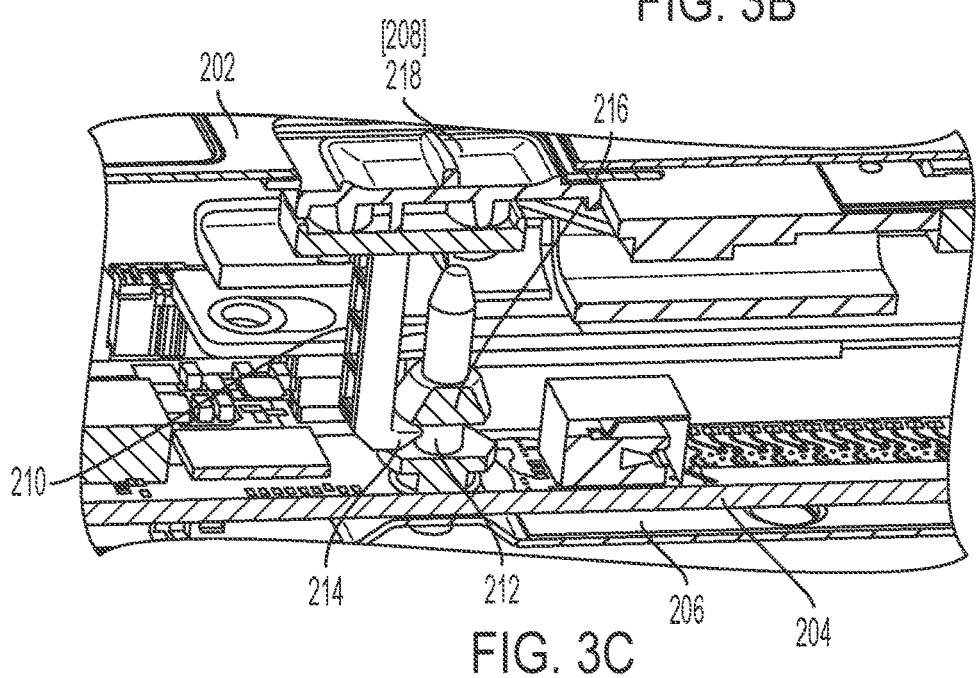
FIG. 3C
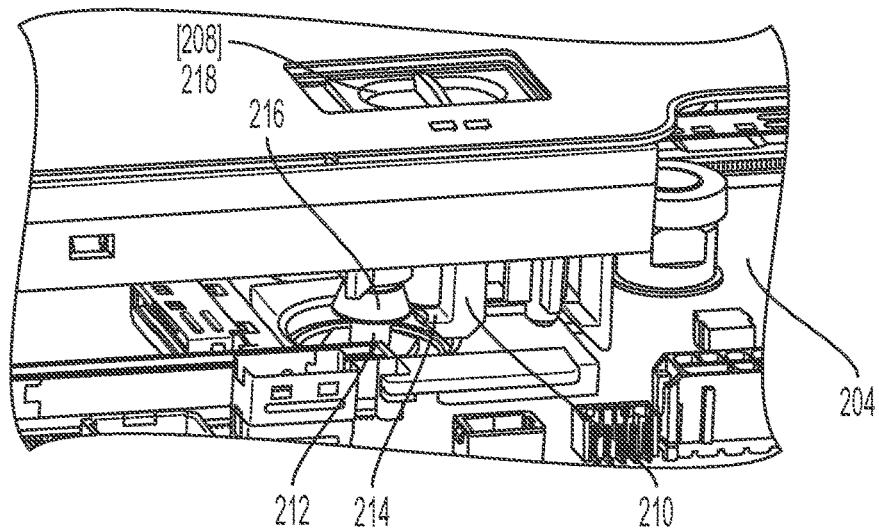
FIG. 3D

RISER CAGE FASTENERS FOR AN INFORMATION HANDLING SYSTEM

FIELD OF THE DISCLOSURE

The instant disclosure relates to information handling systems. More specifically, portions of this disclosure relate to fasteners to removably secure riser cages and, optionally, electronic components coupled thereto, within the systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are challenged every generation to incorporate more or larger components compared to generations prior into the same or smaller form-factors. However, this reduces space on the mainboard or in other spaces within information handling systems for components such as riser cages and expansion cards coupled thereto and components for securing the riser cages and expansion cards within the information handling systems.

SUMMARY

A mechanism for securing a riser cage to a surface may use one or more fasteners to mechanically secure a riser cage to a surface. The one or more fasteners may include a protrusion configured to engage a pin coupled to the surface. Installing or removing the riser cage may be performed by operating the fasteners to secure or release a riser cage from a surface by actuating the one or more fasteners of the riser cage to engage or disengage the protrusion of the fasteners from a complementary structure. The fasteners of the riser cage may include, for example, slides, knobs, switches, or a combination thereof, and the fasteners may secure the riser cage to or release the riser cage from the surface by sliding, rotating, or actuating, respectively, the fasteners. Additionally, the fasteners may secure electrical coupling between electronic components of the riser cage and electronic connectors of electronic components mounted to the surface. For example, the fasteners of the riser cage may be positioned adjacent to the electronic connectors of a mainboard mounted to the surface to secure electrical coupling between the electronic components of the riser cage and the electronic connectors of the mainboard mounted to the surface. The adjacent location of the fastener to each of the electrical couplings may be facilitated by the reduced clearance required around each of the fasteners and/or that each of the fasteners can be operated by interaction with a top surface of the lock.

A mechanism, such as described herein, may reduce the space and complexity associated with securing riser cages and/or electronic components coupled thereto in an information handling system (IHS), and allow for improved electrical connectivity and/or smaller form factor information handling systems. Multiple types of electronic connectors are used and/or the electronic connectors of electronic components of the chassis are located both centrally and peripherally with respect to the riser cage, and fasteners positioned adjacent to the connectors may better secure contact between conductors within the connectors. This can reduce the likelihood of a disconnect or communication failure, and improve resilience to jarring forces that may dislodge the connectors, such as during shipping.

According to one embodiment, an apparatus may include a riser cage configured to removably secure one or more electronic components to a surface and one or more fasteners configured to couple the riser cage to the surface, the one or more fasteners comprising a protrusion configured to engage a pin coupled to the surface.

In some embodiments, the riser cage comprises one or more electronic connectors configured to couple the one or more electronic components to components outside the riser cage. In some embodiments, the one or more fasteners of the riser cage are positioned adjacent to the one or more electronic connectors. In some embodiments, the protrusion of the one or more fasteners comprises a hook or tab.

In some embodiments, the protrusion is movable relative to the riser cage between a first locked position in which the pin coupled to the surface is engaged by the protrusion and a second unlocked position in which the pin coupled to the surface is not engaged by the protrusion. In some embodiments, the one or more fasteners of the riser cage comprise a slide coupled to the protrusion. The protrusion may be slideable along the riser cage between the first locked position and the second unlocked position. In some embodiments, the one or more fasteners of the riser cage comprise a knob coupled to the protrusion. The protrusion may be rotatable relative to the riser cage between the first locked position and the second unlocked position. In some embodiments, the protrusion is rotatable about an axis that is substantially parallel to a longitudinal axis of the pin. In some embodiments, the one or more fasteners of the riser cage comprise a switch coupled to the protrusion. The protrusion may be pivotable relative to the riser cage between the first locked position and the second unlocked position. In some embodiments, the protrusion is rotatable about an axis that is substantially perpendicular to a longitudinal axis of the pin.

According to another embodiment, an information handling system may comprise a chassis, a mainboard coupled to the chassis by a pin coupled to the chassis and extending through the mainboard, a riser cage configured to removably secure one or more expansion cards to the chassis, and one or more fasteners configured to couple the riser cage to the chassis, the one or more fasteners comprising a protrusion configured to engage the pin coupled to the chassis.

In some embodiments, the mainboard comprises one or more electronic connectors, wherein the riser cage is coupled to one or more expansion cards, and wherein the riser cage removably couples the one or more expansion cards to the one or more electronic connectors. In some embodiments, the one or more fasteners of the riser cage are positioned adjacent to the one or more electronic connectors. In some embodiments, the one or more fasteners of the riser cage comprise a slide coupled to the protrusion. The protrusion may be slideable along the riser cage between a first locked position in which the pin coupled to the chassis is engaged by the protrusion and a second unlocked position in which the pin coupled to the chassis is not engaged by the protrusion. In some embodiments, the one or more fasteners of the riser cage comprise a knob coupled to the protrusion. The protrusion may be rotatable relative to the riser cage between a first locked position in which the pin coupled to the chassis is engaged by the protrusion and a second unlocked position in which the pin coupled to the chassis is not engaged by the protrusion. In some embodiments, the one or more fasteners of the riser cage comprise a switch coupled to the protrusion. The protrusion may be pivotable relative to the riser cage between a first locked position in which the pin coupled to the chassis is engaged by the protrusion and a second unlocked position in which the pin coupled to the chassis is not engaged by the protrusion.

According to another embodiment, a method comprises securing a riser cage to a surface by actuating one or more fasteners of the riser cage that couple the riser cage to the surface. The one or more fasteners may comprise a protrusion that engages a pin coupled to the surface. The protrusion of the one or more fasteners may move relative to the riser cage between a first locked position in which the pin coupled to the surface is engaged by the protrusion and a second unlocked position in which the pin coupled to the surface is not engaged by the protrusion. Moving the protrusion of the one or more fasteners to the first locked position may cause the protrusion to engage the pin coupled to the surface to secure the riser cage to the surface.

In some embodiments, the one or more fasteners of the riser cage comprise a slide coupled to the protrusion, and wherein the protrusion is slideable along the riser cage between the first locked position and the second unlocked position. In some embodiments, the one or more fasteners of the riser cage comprise a knob coupled to the protrusion, and wherein the protrusion is rotatable relative the riser cage between the first locked position and the second unlocked position. In some embodiments, the one or more fasteners of the riser cage comprise a switch coupled to the protrusion, and wherein the protrusion is pivotable relative to the riser cage between the first locked position and the second unlocked position.

As used herein, the term "coupled" means connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed configuration, the term "substantially" may be substituted with "within [a percentage] of" what is specified, where the percentage includes 0.1, 1, 5, and 10 percent.

The phrase "and/or" means "and" or "or". To illustrate, A, B, and/or C includes: A alone, B alone, C alone, a combination of A and B, a combination of A and C, a combination of B and C, or a combination of A, B, and C. In other words, "and/or" operates as an inclusive or.

Further, a device or system that is configured in a certain way is configured in at least that way, but it can also be configured in other ways than those specifically described.

The terms "comprise" (and any form of comprise, such as "comprises" and "comprising"), "have" (and any form of have, such as "has" and "having"), and "include" (and any form of include, such as "includes" and "including") are open-ended linking verbs. As a result, an apparatus or system that "comprises," "has," or "includes" one or more elements possesses those one or more elements, but is not limited to possessing only those elements. Likewise, a method that "comprises," "has," or "includes," one or more steps possesses those one or more steps, but is not limited to possessing only those one or more steps.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 3A is a schematic of a top view of a slide fastener according to embodiments of the disclosure.

FIG. 3B is a schematic of a side view of a riser cage illustrating a locking or engaging mechanism of the slide fastener of FIG. 3A according to embodiments of the disclosure.

FIG. 3C is a side view of a riser case illustrating a configuration of the slide fastener of FIGS. 3A and 3B in a locked or engaged position according to embodiments of the disclosure.

FIG. 3D is a side view of a riser cage illustrating a configuration of a slide fastener of FIGS. 3A and 3B in an unlocked or disengaged position according to embodiments of the disclosure.

DETAILED DESCRIPTION

Figure 1:
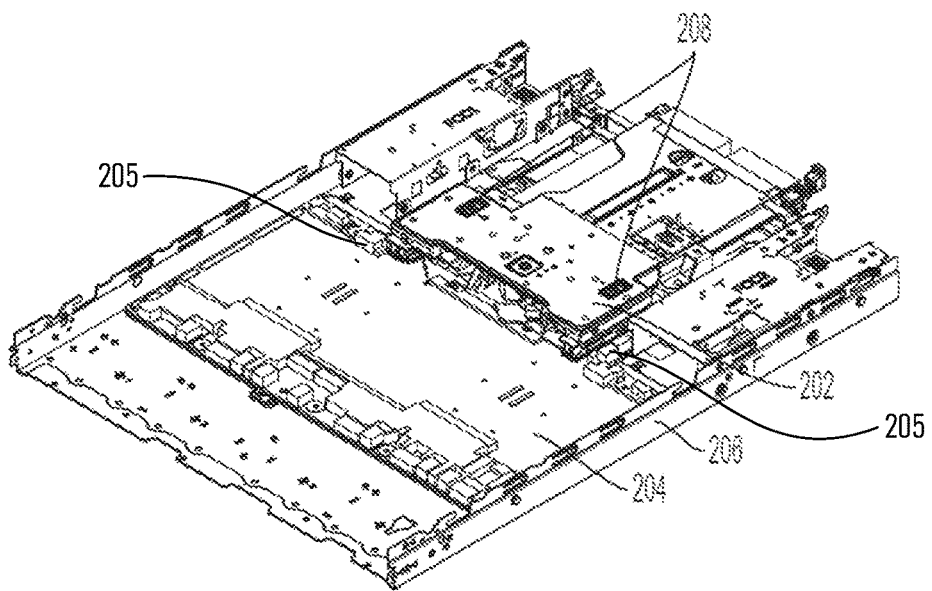
FIG. 1 is a top profile view of a riser cage configured to removably secure one or more electronic components to a surface according to embodiments of the disclosure.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Electronic components in an IHS may be connected as expansion cards in riser cages. Expansion cards (e.g., sound, video, serial and parallel, USB, FireWire, storage, modem, wireless/cellular, TV tuner, and video capture cards) may be inserted into electronic connectors of a riser cage, and the riser cage may removably secure the expansion cards in electrical connection with electronic connectors of a mainboard of the IHS that is mounted on a surface of the IHS. The riser cage may overlie the expansion cards and electronic connectors of the mainboard to protect and secure electrical coupling between the expansion cards and the electronic connectors of the mainboard.

Pinch-to-release, thumbscrews, and/or quarter-turn fasteners have been used to secure conventional riser cages within IHS s. These structures are positioned along the perimeter of the riser cage and are also not optimized to adequately secure multiple connections between electronic components of the riser cage and electronic connectors of electronic components of the chassis. Pinch-to-release and some central fasteners require excessive user involvement for operation because they must be constantly engaged by a first user during release of the riser cage while a second user lifts the riser cage from the chassis. Thumbscrews, and quarter-turn fasteners can be unintuitive, requiring detailed instructions for attaching and/or securing or releasing the riser cage, and expensive to implement and time consuming to actuate. Furthermore, pinch-to-release, thumbscrews, and/or quarter-turn fasteners require increased clearance around the fastener for access by a user's fingers during release of the riser cage and may also require additional structure to protect a user's fingers or the electronic components, thereby reducing space available for other components or functionality and adversely impacting thermal performance of the system.

Shortcomings mentioned here are only representative and are included to highlight problems that the inventors have identified with respect to existing information handling systems and sought to improve upon. Aspects of the information handling systems described herein may address some or all of the shortcomings as well as others known in the art. Aspects of the improved information handling systems described below may present other benefits than, and be used in other applications than, those described above.

Connection and stability of riser cages within an information handling can be improved with aspects of embodiments described herein. For example, in some embodiments of the disclosed invention, the riser cage may be mechanically secured via one or more fasteners to a surface (e.g., a chassis having a surface) to which the mainboard is mounted. These fasteners can be manipulated between a locked or engaged configuration and an unlocked or disengaged configuration to allow coupling of the riser cage to the surface and coupling of expansion cards to electronic connectors of the mainboard mounted to the surface. In these embodiments, the riser cage and expansion cards are removably secured to the surface, which can make the manufacturing, shipping, and/or servicing of an IHS more stable and secure, easier, and faster. One example embodiment of such a riser cage apparatus is shown in FIG. 1.

FIG. 1 is a top profile view of a riser cage 200 according to embodiments of the disclosure. For example, riser cage 200 may be secured against a mainboard 204 and coupled to surface 206, such as a chassis, backplane, or other mainboard. In some embodiments, surface 206 is a chassis. Mainboard 204 may be mounted to surface 206 via, e.g., a bracket or other hardware.

Figure 2:
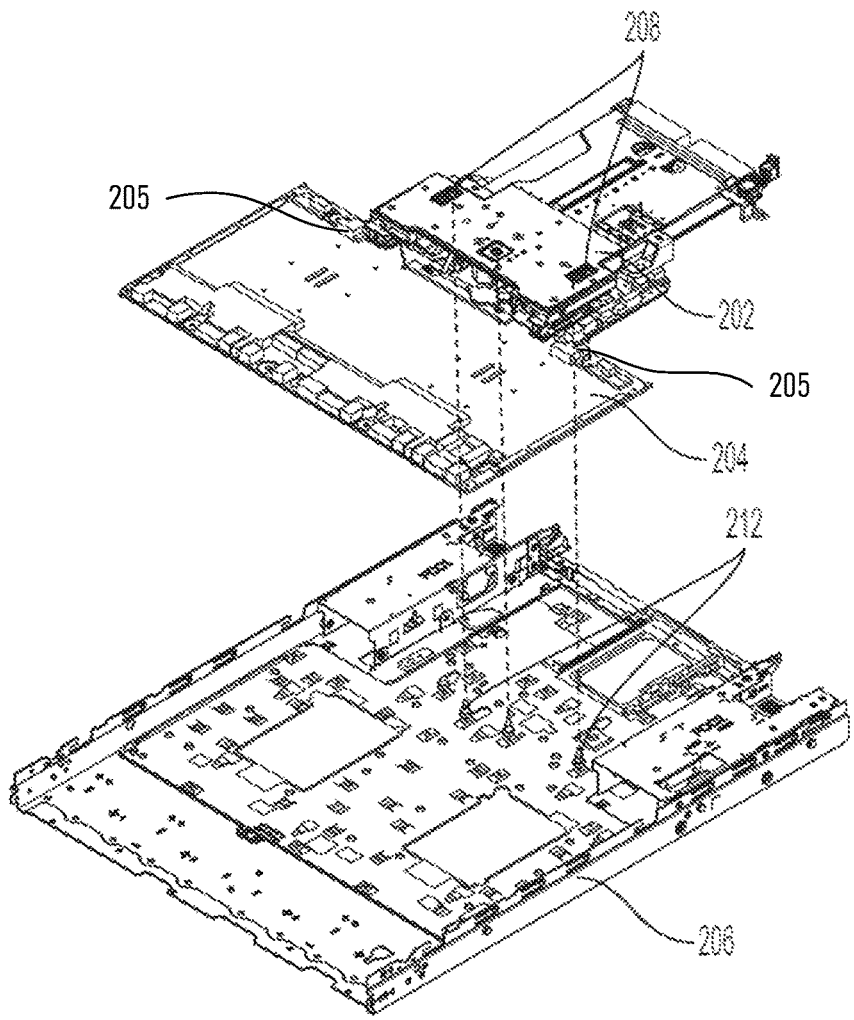
FIG. 2 is a partially exploded top profile view of the riser cage and the surface of FIG. 1 and illustrates an arrangement of the riser cage and with respect to the surface according to embodiments of the disclosure.

Embodiments of the riser cage 200 of FIG. 1 are shown in more detail in FIGS. 2-5. FIG. 2 is a partially exploded top profile view of riser cage 202 and mainboard 204 shown separately from surface 206 and illustrates a configuration of riser cage 202 and mainboard 204 with respect to surface 206, in which riser cage 202 is secured against mainboard 204 and coupled to surface 206.

Riser cage 200 may have one or more electronic connectors for electrical coupling to one or more electronic components (e.g., expansion card(s) in the riser cage). When secured against mainboard 204 and coupled to surface 206, riser cage 200 may be configured to secure an electronic component to a surface. When secured against mainboard 204 and coupled to surface 206, riser cage 200 may be configured to removably secure an electronic component to a surface. Additionally, riser cage 200 may be configured to couple the electronic component to other components in or on the surface, such as through one or more ribbon cable connectors. The riser cage 200 may be configured to receive electronic components through expansion bus interfaces or expansion card slots, which include, but are not limited to, PCI Extended (PCI-X), PCI Express (PCIe), Mini PCIe, M.2, Accelerated Graphics Port (AGP), Conventional PCI (PCI), Industry Standard Architecture (ISA), Micro Channel Architecture (MCA), VESA Local Bus (VLB), CardBus/PC card/PCMCIA, ExpressCard, Audio/Modem Riser (AMR), Communications and Networking Riser (CNR), Compact-Flash, SBus, Zorro, and/or NuBus. Additionally, or alternatively, the electronic component(s) (e.g., expansion card(s)) may couple directly to the system rather than through a bus interface and may include, but are not limited to, an Enhanced Graphics Adapter piggyback board, Expanded memory piggyback board, Redundant array of independent drives (RAID) daughterboard, Network interface controller (NIC) daughterboard, CPU Socket daughterboard, Bluetooth daughterboard, Modem daughterboard, AD/DA/DIO daughter-card, Communication daughterboard (CDC), Server Management daughterboard (SMDC), Serial ATA connector daughterboard, Robotic daughterboard, Access Control List daughterboard, Arduino "shield" daughterboard, Beaglebone "cape" daughterboard, and/or Network Daughterboard (NDB). Riser cage 200 may include greater than or equal to any one of, or between any two of, 1, 2, 3, or more electronic connectors. In some embodiments, riser cage 200 may removably secure the electronic component(s) to mainboard 204 mounted to surface 206 and/or electrically couple the electronic component(s) to other components of mainboard 204 on surface 206.

Mainboard 204 may also include one or more electronic connectors 205 or electrical coupling to one or more electronic components (e.g., expansion card(s)) coupled and electrically connected to riser cage 202. Mainboard 204 may include greater than or equal to any one of, or between any two of, 1, 2, 3, 4, 5, 6, 7, 8, 9, 10, or more electronic connectors 205. Electronic connectors 205 of mainboard 204 can include, but are not limited to, edge connectors and circular connectors. Edge connectors 205 may mate with the edges of mainboard 204, which may be a single-sided or double-sided printed circuit board, in order to provide an external electrical connection. Edge connectors 205 may include one or two rows of electrical pin contacts made of, e.g., gold, copper, nickel, or silver, and contact pitch can range from 0.5 mm to 3 mm (e.g., greater than or equal to any one of, or between any two of, 0.5 mm, 0.75 mm, 1 mm, 1.25 mm, 1.5 mm, 1.75 mm, 2 mm, 2.25 mm, 2.5 mm, 2.75 mm, or 3 mm) between pins in the one or two rows. Edge connectors 205 may be straight or right angle with respect to mainboard 204. Circular connectors are multi-pin connectors that may be mounted to mainboard 204 using bulkheads, jam nuts, flanges, and/or inline cable mounts. A circular connector may be either a male type or female type, with male-type circular connectors including electrical pin contacts that plug into a socket or similar receptacle and female-type circular connectors including sockets that are aligned to receive a pin-type connector. Circular connector electrical pin contacts may be made of, e.g., gold, copper, nickel, or silver, and size and number of electrical pin contacts within a circular connector may be defined according to application of the circular connector.

Riser cage 200 may further include one or more fasteners 208 for removably securing riser cage 202 against mainboard 204 and/or coupling riser cage 202 to surface 206. Removably securing riser cage 202 against mainboard 204 may also removably secure an electronic component coupled to riser cage 202 to mainboard 204 mounted to surface 206 and/or electrically couple the electronic component to other components of mainboard 204 on surface 206. In the embodiments shown in FIGS. 3-5, fastener(s) 208 include a protrusion 210 configured to engage a pin 212. Protrusion 210 of fastener(s) 208 may be integrally connected to fastener(s) 208 such that protrusion 210 and fastener(s) 208 comprise a single piece of material, e.g., metal or plastic. Alternatively, protrusion 210 may be a separate component attached to fastener(s) 208. Pin 212 may be coupled to and extend from surface 206 through an opening (e.g., hole, slot, recess, and/or the like) in mainboard 204. Alternatively, pin 212 may be coupled to and extend from mainboard 204. Pin 212 of surface 206 or mainboard 204 may be integrally connected to surface 206 or mainboard 204 such that pin 212 and surface 206 or mainboard 204 comprise a single piece of material, e.g., sheet metal or plastic. Alternatively, pin 212 may be a separate component attached to other components within the IHS or the surface 206 or mainboard 204 of the IHS and may be configured to secure riser cage 202 against mainboard 204 and/or couple riser cage 202 to surface 206 or mainboard 204 by engaging protrusion 210 of fastener(s) 208.

Riser cage 200 may include, e.g., greater than or equal to any one of, or between any two of, 1, 2, 3, 4, 5, 6, 7, 8, 9, 10, or more fasteners. In some embodiments, fastener 208 is positioned adjacent to each electronic connector 205 of mainboard 204 (e.g., faster 208 is positioned within equal to any one of, or between any two of, 0.1 mm, 0.5 mm, 1 mm, 1.5 mm, 2 mm, 2.5 mm, 3 mm, 3.5 mm, 4 mm, 4.5 mm, 5 mm, 5.5 mm, 6 mm, 6.5 mm, 7 mm, 7.5 mm, 8 mm, 8.5 mm, 9 mm, 9.5 mm, or 10 mm of electronic connector of mainboard 204). In some embodiments, a connector that is adjacent to the fastener 208 may be located such that there are no other physical structures between the fastener 208 and the connector. For example, in the embodiment illustrated in FIGS. 1 and 2, mainboard 204 includes 3 electronic connectors, and each of the three electronic connectors 205 are positioned adjacent to a fastener 208 on riser cage 202. In other embodiments, a fastener 208 is positioned adjacent to less than all electronic connectors 205 of mainboard 204. Positioning of fastener(s) 208 adjacent to electronic connector(s) of mainboard 204 can secure the electronic connector(s) from disconnect during shipping or operation, for example. Additionally, because fastener(s) 208 of riser cage 202 are disposed on riser cage 202 as part of riser cage 200, less space or clearance is needed for a user to implement a mechanism to secure riser cage 202 within an IHS, which has the additional benefit of reducing thermal impact of components used to secure riser cage 202 to surface 206. Also, because multiple electronic connections 205 can all be secured by the same riser cage 200, the cost effectiveness of implementing riser cage 200 is improved.

Referring to FIGS. 3-5, protrusion 210 of fastener(s) 208 may extend from riser cage 202 toward mainboard 204 through an opening (e.g., hole, slot, recess, and/or the like) in riser cage 202. Additionally, protrusion 210 may be any structure capable of mechanical engagement of pin 212. For example, in some embodiments, protrusion 210 comprises a hook 214 or tab 224. Pin 212 of surface 206 may be any structure capable of receiving and/or retaining protrusion 210. In some embodiments, pin 212 comprises a flange 216. For example, in the specific embodiment shown in FIG. 3, fastener(s) 208 include a hook that engages a flange of pin 212 to removably secure riser cage 202 against mainboard 204 and/or couple riser cage 202 to surface 206, which may also removably secure an electronic component coupled to riser cage 202 to mainboard 204 mounted to surface 206 and/or electrically couple the electronic component to other components of mainboard 204 on surface 206. In the specific embodiment shown in FIG. 4, fastener(s) 208 include a tab that engages a flange of pin 212 to removably secure riser cage 202 against mainboard 204 and/or couple riser cage 202 to surface 206. When positioned near an electronic connector, the fastener(s) 208 may improve stability of an electronic connection between the mainboard 204 and the riser cage 202. The interchangeability of fastener(s) 208 and/or the compatibility of fastener(s) 208 with multiple types of electronic connectors may allow riser cage 200 to be easily implemented across locations and different riser cages.

To facilitate the attachment or release of riser cage 202 from mainboard 204 and surface 206, protrusion 210 of fastener(s) 208 may be movable relative to riser cage 202 between a first locked position in which pin 212 of surface 206 is engaged by protrusion 210 and a second unlocked position in which pin 212 of surface 206 is not engaged by protrusion 210. When protrusion 210 of fastener(s) 208 is in the first locked position, protrusion 210 engages pin 212 of surface 206 to secure riser cage 202 against mainboard 204 mounted to surface 206. Additionally, or alternatively, when protrusion 210 of fastener(s) 208 is in the first locked position, protrusion 210 engages pin 212 of surface 206 to secure an electronic component coupled to riser cage 202 to mainboard 204 mounted to surface 206 and/or electrically couple the electronic component to other components of mainboard 204 on surface 206. The present riser cage 200 can therefore ease the operation of attaching and/or securing riser cages to surfaces as well as releasing the riser cages from surfaces because once in the fastener and protrusion are in the second unlocked position, no additional user interaction is required to maintain the fastener in the unlocked position.

With reference to FIG. 3A, fastener(s) 208 of riser cage 200 may further comprise a slide 218. Slide 218 may be coupled to protrusion 210 to facilitate movement (e.g., sliding) of protrusion 210 along riser cage 202 (FIG. 3B) between the first locked position (FIG. 3C) and the second unlocked position (FIG. 3D). Movement (e.g., sliding) of protrusion 210 between the first and second positions may be about an axis that is angularly disposed (e.g., substantially perpendicular) relative to a longitudinal axis of pin 212 of surface 206. For example, the angle between protrusion 210 and longitudinal axis of pin 212 may be greater than or equal to any one of, or between any two of, 45 to 135 degrees, from 60 to 120 degrees, from 75 to 105 degrees, 90 degrees, and/or the like.

Figure 4A:
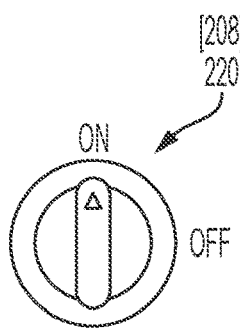
FIG. 4A is a schematic of a top view of a knob fastener according to embodiments of the disclosure.
Figure 4B:
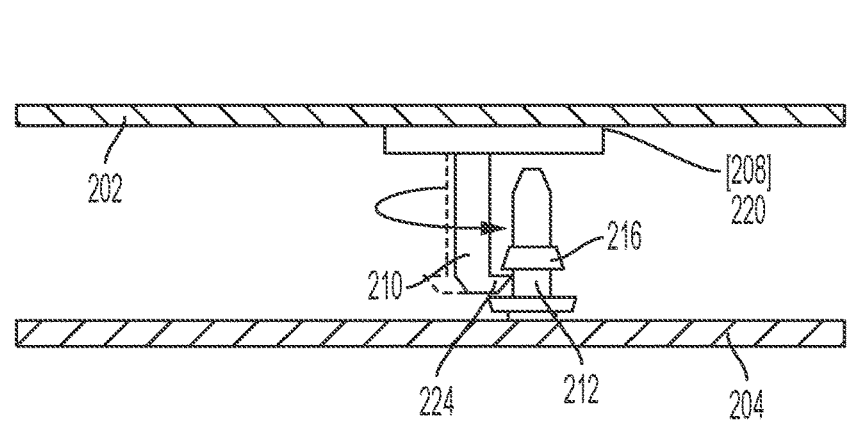
FIG. 4B is a schematic of a side view of a riser cage illustrating a locking or engaging mechanism of the knob fastener of FIG. 4A according to embodiments of the disclosure.
Figure 4C:
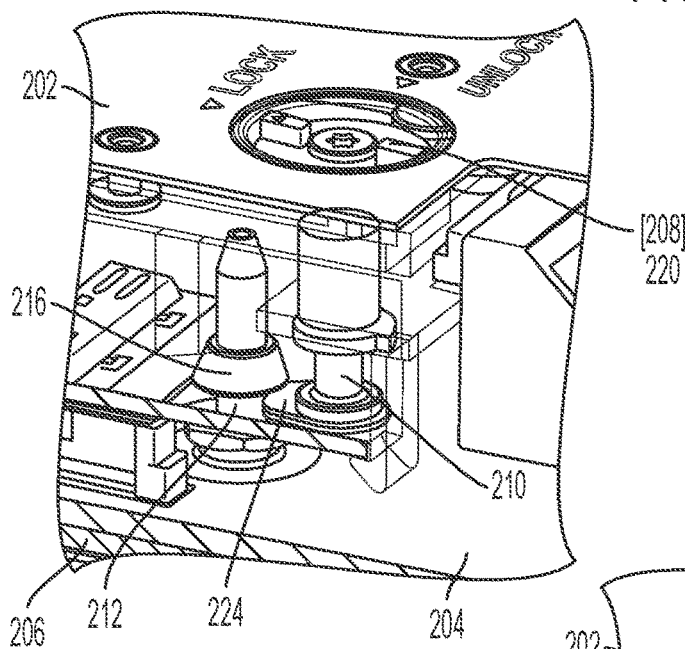
FIG. 4C is a side view of a riser cage illustrating a configuration of the knob fastener of FIGS. 4A and 4B in a locked or engaged position according to embodiments of the disclosure.
Figure 4D:
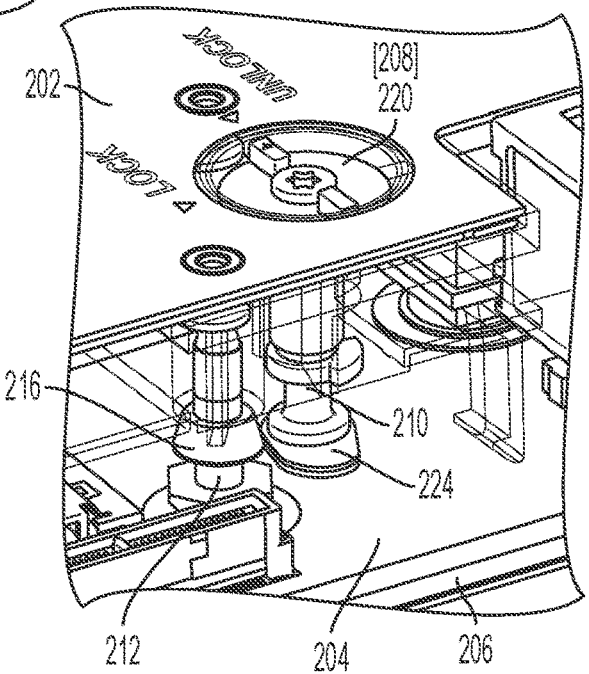
FIG. 4D is a side view of a riser cage illustrating a configuration of a knob fastener of FIGS. 4A and 4B in an unlocked or disengaged position according to embodiments of the disclosure.

Alternatively, or additionally, referencing FIG. 4A, fastener(s) 208 of riser cage 200 may further comprise a knob 220 or other rotatable structure. Knob 220 may be coupled to protrusion 210 to facilitate movement (e.g., rotation) of protrusion 210 relative to riser cage 202 (FIG. 4B) between the first locked position (FIG. 4C) and the second unlocked position (FIG. 4D). Movement (e.g., rotation) of protrusion 210 between the first and second positions may be about an axis that is angularly disposed (e.g., substantially parallel) relative to a longitudinal axis of pin 212 of surface 206. For example, the angle between protrusion 210 and longitudinal axis of pin 212 may be greater than or equal to any one of, or between any two of, 135 to 225 degrees, from 150 to 210 degrees, from 165 to 195 degrees, 180 degrees, and/or the like.

Figure 5A:
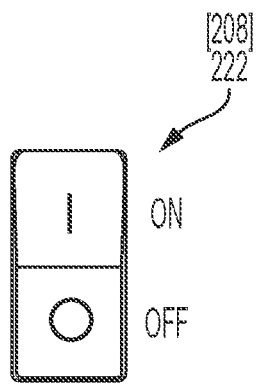
FIG. 5A is a schematic of a top view of the switch fastener according to embodiments of the disclosure.
Figure 5B:
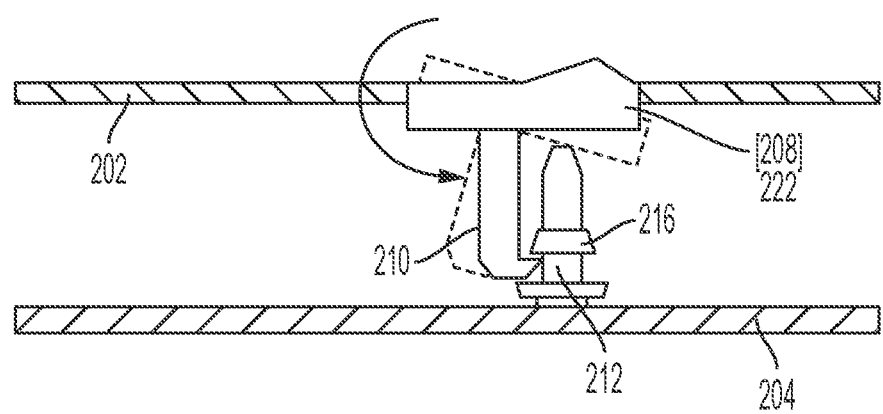
FIG. 5B is a schematic of a side view of a riser cage illustrating a locking or engaging mechanism of the switch fastener of FIG. 5A.

Alternatively, or additionally, referencing FIG. 5A, fastener(s) of riser cage 200 may further comprise a switch 222 or other pivotable structure. Switch 222 may be coupled to protrusion 210 to facilitate movement (e.g., pivoting) of protrusion 210 relative to riser cage 202 between the first locked position and the second unlocked position (FIG. 5B).

Movement (e.g., pivoting) of protrusion 210 between the first and second positions may be about an axis that is angularly disposed (e.g., substantially perpendicular) relative to a longitudinal axis of pin 212 of surface 206. For example, the angle between protrusion 210 and longitudinal axis of pin 212 may be greater than or equal to any one of, or between any two of, 45 to 135 degrees, from 60 to 120 degrees, from 75 to 105 degrees, 90 degrees, and/or the like.

In at least this way, some embodiments of the present riser cage 200 may be configured to removably secure a riser cage and/or one or more electronic components thereof to a surface. This has an additional benefit of being space and cost effective to implement and can ease the operation of attaching or releasing riser cages from surfaces. Further, the riser cage 200 may be easily implemented across locations and different riser cages.

Figure 6:
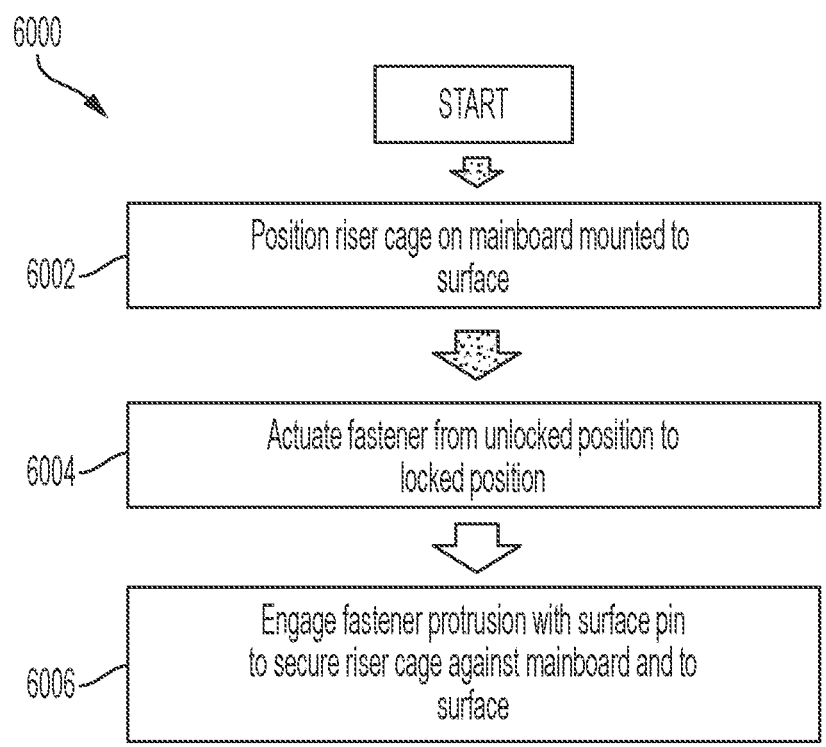
FIG. 6 is a flow chart illustrating a method for engaging a riser cage from a surface according to embodiments of the disclosure.

A method for installing a riser cage (e.g., 200) onto a mainboard (e.g., 204) mounted on a surface (e.g., 206) is shown in FIG. 6. FIG. 6 is a flow chart illustrating a method for assembling an information handling system (e.g., any of those described herein) having a riser cage. To assemble an information handling system having a mainboard (e.g., 204), a surface (e.g., 206), and a riser cage, a method 6000 may allow releasably or removably securing the riser cage on a mainboard mounted on a surface (e.g., on mainboard surface 204 mounted on surface 206) and coupling the riser cage to the surface using one or more fasteners (e.g., 208) coupled to the riser cage.

At block 6002, the riser cage may be positioned such that fasteners of the riser cage are approximately aligned with complementary structures of another surface, such as pins extending through a mainboard. When the riser cage is positioned on the mainboard, electronic components that are electrically coupled to the riser cage via one or more electronic connectors may also be aligned to allow electrically coupling of the riser cage to one or more electronic connectors on the mainboard.

At block 6004, one or more fasteners of the riser cage may be actuated from an unlocked position to a locked position. FIGS. 3D and 4D are profile views of a slide fastener (e.g., 218) and a knob fastener (e.g., 220), respectively, of the riser cage according to embodiments of the disclosure and illustrate positioning of the fastener(s) of the riser cage in the unlocked position at block 6004. FIG. 5B is schematic view of a switch fastener (e.g., 222) of the riser cage according to embodiments of the disclosure and illustrates manipulation of the fastener(s) of the riser cage between the unlocked position and the locked position at block 6004.

At block 6006, movement of the fastener(s) may move a protrusion (e.g., 210) of the fastener(s) relative to the riser cage. FIGS. 3C and 4C are profile views of a slide fastener and a knob fastener, respectively, of the riser cage according to embodiments of the disclosure and illustrate positioning of the fastener(s) of the riser cage in the locked position at block 6006. As shown in FIGS. 3B and 4B, the protrusion is slideable along the riser cage or rotatable relative to the riser cage between the first locked position and the second unlocked position. FIG. 5B is schematic view of a switch fastener of the riser cage according to embodiments of the disclosure and illustrates manipulation of the fastener(s) of the riser cage between the unlocked position and the locked position at block 6006. The protrusion is configured to engage a complementary structure, such as a pin, coupled to the surface such that movement of the fastener(s) relative to the riser cage to the locked position results in movement of the protrusion to engage the pin coupled to the surface. Engagement of the pin by the fastener protrusion may facilitate securing of the riser cage on the mainboard and to the surface and/or may secure the electrical connection between electronic components of the riser cage and the mainboard.

Some methods of releasably or removably securing a riser cage may further comprise release of the riser cage from the information handling system. In embodiments in which the riser cage is released, the steps at blocks 6004 and 6006 of FIG. 6 are repeated, except that the fasteners of the riser cage are actuated from the locked position to the unlocked position. The protrusion is configured to disengage the pin coupled to the surface such that movement of the fastener(s) relative to the riser cage to the unlocked position results in movement of the protrusion to disengage the pin coupled to the surface. Disengagement of the pin by the fastener protrusion may facilitate release of the riser cage from the mainboard and the surface and/or disengagement or disconnection of the electrical connection between electronic components of the riser cage and the mainboard. Then, the riser cage and/or electrical connection between electronic components of the riser cage and the mainboard can be released from the mainboard and surface, and the riser cage can be lifted until the riser cage is no longer in contact with the mainboard. In this manner, a riser cage of the IHS may be removed, for example, for replacement or other service.

Figure 7:
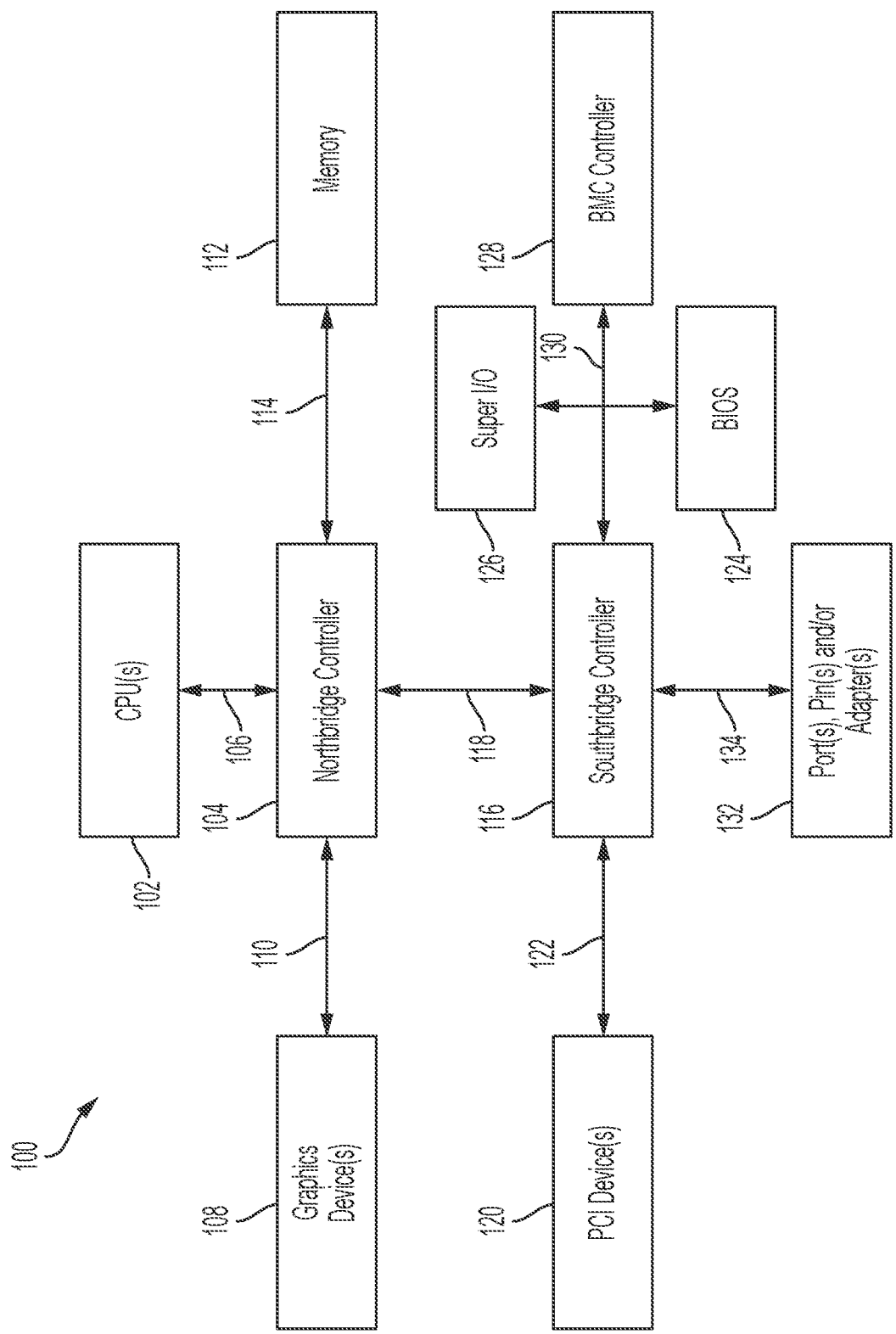
FIG. 7 is a schematic block diagram of an example information handling system according to some embodiments of the disclosure.

These example embodiments describe and illustrate various components and mechanisms for releasably or removably securing a riser cage that may be used to add functionality to an IHS, of which one embodiment is illustrated in FIG. 7. In some embodiments, the riser cage may support one or more electronic components (e.g., expansion cards) for the information handling system. In some embodiments, the electronic components may also be may releasably or removably secured within the information handling system by the riser cage.

The mainboard and/or riser cage described above may each include one or more of the electronic components of an information handling system, such as components of the information handling system shown in FIG. 7. An information handling system may include a variety of components to generate, process, display, manipulate, transmit, and receive information. One example of an information handling system 100 is shown in FIG. 7. FIG. 7 illustrates an example information handling system 100. Information handling system 100 may include a processor 102 (e.g., a central processing unit (CPU)), a memory (e.g., a dynamic random-access memory (DRAM)) 104, and a chipset 106. In some embodiments, one or more of the processor 102, the memory 104, and the chipset 106 may be included on a motherboard (also referred to as a mainboard), which is a printed circuit board (PCB) with embedded conductors organized as transmission lines between the processor 102, the memory 104, the chipset 106, and/or other components of the information handling system. The components may be coupled to the motherboard through packaging connections such as a pin grid array (PGA), ball grid array (BGA), land grid array (LGA), surface-mount technology, and/or through-hole technology. In some embodiments, one or more of the processor 102, the memory 104, the chipset 106, and/or other components may be organized as a System on Chip (SoC).

The processor 102 may execute program code by accessing instructions loaded into memory 104 from a storage device, executing the instructions to operate on data also loaded into memory 104 from a storage device, and generate output data that is stored back into memory 104 or sent to another component. The processor 102 may include processing cores capable of implementing any of a variety of instruction set architectures (ISAs), such as the x86, POWERPC®, ARM®, SPARC®, or MIPS® ISAs, or any other suitable ISA. In multi-processor systems, each of the processors 102 may commonly, but not necessarily, implement the same ISA. In some embodiments, multiple processors may each have different configurations such as when multiple processors are present in a big-little hybrid configuration with some high-performance processing cores and some high-efficiency processing cores. The chipset 106 may facilitate the transfer of data between the processor 102, the memory 104, and other components. In some embodiments, chipset 106 may include two or more integrated circuits (ICs), such as a northbridge controller coupled to the processor 102, the memory 104, and a southbridge controller, with the southbridge controller coupled to the other components such as USB 110, SATA 120, and PCIe buses 108. The chipset 106 may couple to other components through one or more PCIe buses 108.

Some components may be coupled to one bus line of the PCIe buses 108, whereas some components may be coupled to more than one bus line of the PCIe buses 108. One example component is a universal serial bus (USB) controller 110, which interfaces the chipset 106 to a USB bus 112. A USB bus 112 may couple input/output components such as a keyboard 114 and a mouse 116, but also other components such as USB flash drives, or another information handling system. Another example component is a SATA bus controller 120, which couples the chipset 106 to a SATA bus 122. The SATA bus 122 may facilitate efficient transfer of data between the chipset 106 and components coupled to the chipset 106 and a storage device 124 (e.g., a hard disk drive (HDD) or solid-state disk drive (SDD)) and/or a compact disc read-only memory (CD-ROM) 126. The PCIe bus 108 may also couple the chipset 106 directly to a storage device 128 (e.g., a solid-state disk drive (SDD)). A further example of an example component is a graphics device 130 (e.g., a graphics processing unit (GPU)) for generating output to a display device 132, a network interface controller (NIC) 140, and/or a wireless interface 150 (e.g., a wireless local area network (WLAN) or wireless wide area network (WWAN) device) such as a Wi-Fi® network interface, a Bluetooth® network interface, a GSM® network interface, a 3G network interface, a 4G LTE® network interface, and/or a 5G NR network interface (including sub-6 GHz and/or mmWave interfaces). In one example embodiment, chipset 106 may be directly connected to an individual end point via a PCIe root port within the chipset and a point-to-point topology as shown in FIG. 7.

The chipset 106 may also be coupled to a serial peripheral interface (SPI) and/or Inter-Integrated Circuit (I2C) bus 160, which couples the chipset 106 to system management components. For example, a non-volatile random-access memory (NVRAM) 170 for storing firmware 172 may be coupled to the bus 160. As another example, a controller, such as a baseboard management controller (BMC) 180, may be coupled to the chipset 106 through the bus 160. BMC 180 may be referred to as a service processor or embedded controller (EC). Capabilities and functions provided by BMC 180 may vary considerably based on the type of information handling system. For example, the term baseboard management system may be used to describe an embedded processor included at a server, while an embedded controller may be found in a consumer-level device. As disclosed herein, BMC 180 represents a processing device different from processor 102, which provides various management functions for information handling system 100. For example, an embedded controller may be responsible for power management, cooling management, and the like. An embedded controller included at a data storage system may be referred to as a storage enclosure processor or a chassis processor.

System 100 may include additional processors that are configured to provide localized or specific control functions, such as a battery management controller. Bus 160 can include one or more busses, including a Serial Peripheral Interface (SPI) bus, an Inter-Integrated Circuit (I2C) bus, a system management bus (SMBUS), a power management bus (PMBUS), or the like. BMC 180 may be configured to provide out-of-band access to devices at information handling system 100. Out-of-band access in the context of the bus 160 may refer to operations performed prior to execution of firmware 172 by processor 102 to initialize operation of system 100.

Firmware 172 may include instructions executable by processor 102 to initialize and test the hardware components of system 100. For example, the instructions may cause the processor 102 to execute a power-on self-test (POST). The instructions may further cause the processor 102 to load a boot loader or an operating system (OS) from a mass storage device. Firmware 172 additionally may provide an abstraction layer for the hardware, such as a consistent way for application programs and operating systems to interact with the keyboard, display, and other input/output devices. When power is first applied to information handling system 100, the system may begin a sequence of initialization procedures, such as a boot procedure or a secure boot procedure. During the initialization sequence, also referred to as a boot sequence, components of system 100 may be configured and enabled for operation and device drivers may be installed. Device drivers may provide an interface through which other components of the system 100 can communicate with a corresponding device. The firmware 172 may include a basic input-output system (BIOS) and/or include a unified extensible firmware interface (UEFI). Firmware 172 may also include one or more firmware modules of the information handling system. Additionally, configuration settings for the firmware 172 and firmware of the information handling system 100 may be stored in the NVRAM 170. NVRAM 170 may, for example, be a non-volatile firmware memory of the information handling system 100 and may store a firmware memory map namespace 100 of the information handling system. NVRAM 170 may further store one or more container-specific firmware memory map namespaces for one or more containers concurrently executed by the information handling system.

Information handling system 100 may include additional components and additional busses, not shown for clarity. For example, system 100 may include multiple processor cores (either within processor 102 or separately coupled to the chipset 106 or through the PCIe buses 108), audio devices (such as may be coupled to the chipset 106 through one of the PCIe busses 108), or the like. While a particular arrangement of bus technologies and interconnections is illustrated for the purpose of example, one of skill will appreciate that the techniques disclosed herein are applicable to other system architectures. System 100 may include multiple processors and/or redundant bus controllers. In some embodiments, one or more components may be integrated together in an integrated circuit (IC), which is circuitry built on a common substrate. For example, portions of chipset 106 can be integrated within processor 102. Additional components of information handling system 100 may include one or more storage devices that may store machine-executable code, one or more communications ports for communicating with external devices, and various input and output (I/O) devices, such as a keyboard, a mouse, and a video display.

In some embodiments, processor 102 may include multiple processors, such as multiple processing cores for parallel processing by the information handling system 100. For example, the information handling system 100 may include a server comprising multiple processors for parallel processing. In some embodiments, the information handling system 100 may support virtual machine (VM) operation, with multiple virtualized instances of one or more operating systems executed in parallel by the information handling system 100. For example, resources, such as processors or processing cores of the information handling system may be assigned to multiple containerized instances of one or more operating systems of the information handling system 100 executed in parallel. A container may, for example, be a virtual machine executed by the information handling system 100 for execution of an instance of an operating system by the information handling system 100. Thus, for example, multiple users may remotely connect to the information handling system 100, such as in a cloud computing configuration, to utilize resources of the information handling system 100, such as memory, processors, and other hardware, firmware, and software capabilities of the information handling system 100. Parallel execution of multiple containers by the information handling system 100 may allow the information handling system 100 to execute tasks for multiple users in parallel secure virtual environments.

The schematic flow chart diagram of FIG. 6 is generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software and/or firmware.

If implemented in firmware and/or software, operational adjustment functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data related to the operational adjustment functions may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a riser cage configured to removably secure one or more electronic components to a surface; and
one or more fasteners configured to couple the riser cage to the surface, the one or more fasteners comprising a protrusion configured to engage a pin to the surface,
wherein the one or more fasteners of the riser cage comprise a knob coupled to the protrusion;
wherein the pin comprises a flange extending radially from the pin at a distance from the surface corresponding to the first locked position of the protrusion; and
wherein the protrusion is configured to engage the pin at the flange in a single plane of motion substantially parallel to the surface.

2. The apparatus of claim 1, wherein the riser cage comprises one or more electronic connectors configured to couple the one or more electronic components to components outside the riser cage.

3. The apparatus of claim 2, wherein the one or more fasteners of the riser cage are positioned adjacent to the one or more electronic connectors.

4. The apparatus of claim 1, wherein the protrusion comprises a hook or tab.

5. The apparatus of claim 1, wherein the protrusion is movable relative to the riser cage between a first locked position in which the pin coupled to the surface is engaged by the protrusion and a second unlocked position in which the pin coupled to the surface is not engaged by the protrusion.

6. The apparatus of claim 5, wherein the protrusion is rotatable relative to the riser cage between the first locked position and the second unlocked position.

7. The apparatus of claim 6, wherein the protrusion is rotatable about an axis that is substantially parallel to a longitudinal axis of the pin.

8. An information handling system, comprising:
a chassis;
a mainboard coupled to the chassis by a pin coupled to the chassis and extending through the mainboard;
a riser cage configured to removably secure one or more expansion cards to the chassis; and
one or more fasteners configured to couple the riser cage to the chassis, the one or more fasteners comprising a protrusion configured to engage the pin coupled to the chassis,
wherein the one or more fasteners of the riser cage comprise a knob coupled to the protrusion;
wherein the pin comprises a flange extending radially from the pin at a distance from the surface corresponding to the first locked position of the protrusion; and
wherein the protrusion is configured to engage the pin at the flange in a single plane of motion substantially parallel to the surface.

9. The information handling system of claim 8, wherein the mainboard comprises one or more electronic connectors, wherein the riser cage is coupled to the one or more expansion cards, and wherein the riser cage removably couples the one or more expansion cards to the one or more electronic connectors.

10. The information handling system of claim 9, wherein the one or more fasteners of the riser cage are positioned adjacent to the one or more electronic connectors.

11. The information handling system of claim 8, wherein the protrusion is rotatable relative to the riser cage between a first locked position in which the pin coupled to the chassis is engaged by the protrusion and a second unlocked position in which the pin coupled to the chassis is not engaged by the protrusion.

12. A method comprising securing a riser cage to a surface by actuating one or more fasteners of the riser cage that couple the riser cage to the surface,
wherein the one or more fasteners comprise a protrusion that engages a pin coupled to the surface,
wherein the protrusion of the one or more fasteners moves relative to the riser cage between a first locked position in which the pin coupled to the surface is engaged by the protrusion and a second unlocked position in which the pin coupled to the surface is not engaged by the protrusion;
wherein moving the protrusion of the one or more fasteners to the first locked position causes the protrusion to engage the pin coupled to the surface to secure the riser cage to the surface;
wherein the one or more fasteners of the riser cage comprise a knob coupled to the protrusion;
wherein the pin comprises a flange extending radially from the pin at a distance from the surface corresponding to the first locked position of the protrusion; and wherein the protrusion is configured to engage the pin at the flange in a single plane of motion substantially parallel to the surface.

13. The method of claim 12, wherein the protrusion is rotatable relative the riser cage between the first locked position and the second unlocked position.

* * * * *